United States Patent
Mohan et al.

(10) Patent No.: US 10,587,027 B2
(45) Date of Patent: Mar. 10, 2020

(54) SPATIAL COMBINING DEVICES FOR HIGH-FREQUENCY OPERATION

(71) Applicant: Qorvo US, Inc., Greensboro, NC (US)

(72) Inventors: Ankush Mohan, Thousand Oaks, CA (US); Eric Jackson, Moorpark, CA (US); Soack Yoon, Torrance, CA (US); John Kitt, Ventura, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/846,840

(22) Filed: Dec. 19, 2017

(65) Prior Publication Data

US 2019/0067782 A1  Feb. 28, 2019

Related U.S. Application Data

(60) Provisional application No. 62/548,448, filed on Aug. 22, 2017, provisional application No. 62/548,460, filed on Aug. 22, 2017, provisional application No. 62/548,447, filed on Aug. 22, 2017, provisional application No. 62/548,464, filed on Aug. 22, 2017, (Continued)

(51) Int. Cl.
| | |
|---|---|
| *H04B 1/04* | (2006.01) |
| *H01P 5/12* | (2006.01) |
| *H01P 3/06* | (2006.01) |
| *H01P 5/103* | (2006.01) |
| *H01P 11/00* | (2006.01) |

(Continued)

(52) U.S. Cl.
CPC ............. *H01P 5/12* (2013.01); *H01P 3/06* (2013.01); *H01P 5/103* (2013.01); *H01P 11/005* (2013.01); *H03F 3/19* (2013.01); *H03F 3/211* (2013.01); *H03F 2200/255* (2013.01); *H03F 2200/423* (2013.01); *H03F 2200/451* (2013.01)

(58) Field of Classification Search
CPC .. H01P 5/12; H01P 3/06; H01P 11/005; H03F 2200/423
USPC ......................................................... 343/904
See application file for complete search history.

(56) References Cited

U.S. PATENT DOCUMENTS

| | | |
|---|---|---|
| 3,023,382 A | 2/1962 | Borghetti |
| 4,234,854 A | 11/1980 | Schellenberg et al. |

(Continued)

OTHER PUBLICATIONS

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

(Continued)

*Primary Examiner* — Peguy Jean Pierre
(74) *Attorney, Agent, or Firm* — Withrow & Terranova, P.L.L.C.

(57) ABSTRACT

Spatial power-combining devices for higher frequency operation and increased bandwidth applications are disclosed. The spatial power-combining device includes a center waveguide section with a plurality of amplifier assemblies. The plurality of amplifier assemblies forms an input end and an output end, and an input inner conductor is mechanically attached to the input end, and an output inner conductor is mechanically attached to the output end. A method for joining a plurality of amplifier assemblies together to provide a center waveguide with an input end including an input connector receptacle and an output end including an output connector receptacle is also disclosed.

24 Claims, 9 Drawing Sheets

Related U.S. Application Data provisional application No. 62/548,472, filed on Aug. 22, 2017, provisional application No. 62/548,457, filed on Aug. 22, 2017.

(51) Int. Cl.
*H03F 3/21* (2006.01)
*H03F 3/19* (2006.01)

(56) References Cited

U.S. PATENT DOCUMENTS

| | | |
|---|---|---|
| 4,424,496 A | 1/1984 | Nichols et al. |
| 5,036,335 A | 7/1991 | Jairam |
| 5,214,394 A | 5/1993 | Wong |
| 5,256,988 A | 10/1993 | Izadian |
| 5,736,908 A | 4/1998 | Alexanian et al. |
| 5,920,240 A | 7/1999 | Alexanian et al. |
| 6,028,483 A | 2/2000 | Shealy et al. |
| 6,037,840 A | 3/2000 | Myer |
| 6,181,221 B1 | 1/2001 | Kich et al. |
| 6,828,875 B2 | 12/2004 | Channabasappa et al. |
| 7,110,165 B2 | 9/2006 | Martin et al. |
| 7,215,220 B1 | 5/2007 | Jia |
| 7,466,203 B2 | 12/2008 | Rector |
| 8,698,577 B2 | 4/2014 | Sherrer et al. |
| 8,928,429 B2 | 1/2015 | Song et al. |
| 9,019,036 B2 | 4/2015 | Kolias et al. |
| 9,054,427 B2 | 6/2015 | Guy et al. |
| 9,065,163 B1 * | 6/2015 | Wu .................. H01P 3/12 |
| 9,276,304 B2 | 3/2016 | Behan et al. |
| 9,287,605 B2 | 3/2016 | Daughenbaugh, Jr. et al. |
| 9,325,074 B2 | 4/2016 | Chandler |
| 9,917,343 B2 | 3/2018 | Chieh et al. |
| 9,954,706 B1 | 4/2018 | Harris et al. |
| 10,009,067 B2 | 6/2018 | Birk et al. |
| 10,164,667 B1 | 12/2018 | Kitt |
| 2006/0202777 A1 | 9/2006 | Deckman et al. |
| 2007/0229186 A1 | 10/2007 | Hacker et al. |
| 2007/0279146 A1 | 12/2007 | Rector |
| 2014/0145794 A1 * | 5/2014 | Courtney ............. H01P 5/12 333/125 |
| 2014/0145795 A1 * | 5/2014 | Behan ................ H01P 5/12 333/125 |
| 2014/0167880 A1 * | 6/2014 | Daughenbaugh, Jr. ... H01P 5/12 333/127 |
| 2015/0270817 A1 | 9/2015 | Campbell |
| 2017/0149113 A1 | 5/2017 | Theveneau et al. |
| 2017/0179598 A1 | 6/2017 | Kitt |
| 2018/0294539 A1 | 10/2018 | Kitt |
| 2019/0007007 A1 | 1/2019 | Kitt |
| 2019/0067778 A1 | 2/2019 | Mohan |
| 2019/0067781 A1 | 2/2019 | Mohan et al. |
| 2019/0067783 A1 | 2/2019 | Mohan et al. |
| 2019/0067836 A1 | 2/2019 | Mohan |
| 2019/0068123 A1 | 2/2019 | Mohan et al. |
| 2019/0068140 A1 | 2/2019 | Mohan et al. |
| 2019/0068141 A1 | 2/2019 | Yoon et al. |

OTHER PUBLICATIONS

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Notice of Allowance for U.S. Appl. No. 15/845,225, dated Jan. 10, 2019, 7 pages.

Notice of Allowance for U.S. Appl. No. 16/166,548, dated Nov. 29, 2018, 8 pages.

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Montgomery, R., et al., "Solid-State PAs Battle TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.

Smalc, Martin, et al., "Thermal Performance of Natural Graphite Heat Spreaders," Proceedings of IPACK2005, Jul. 17-22, San Francisco, California, American Society of Mechanical Engineers, 11 pages.

Notice of Allowance for U.S. Appl. No. 15/637,472, dated Mar. 12, 2019, 7 pages.

Non-Final Office Action for U.S. Appl. No. 15/933,783, dated May 1, 2019, 8 pages.

Non-Final Office Action for U.S. Appl. No. 16/042,351, dated Jul. 5, 2019, 5 pages.

Non-Final Office Action for U.S. Appl. No. 15/981,535, dated Jul. 8, 2019, 5 pages.

Non-Final Office Action for U.S. Appl. No. 15/933,821, dated Jul. 11, 2019, 7 pages.

Non-Final Office Action for U.S. Appl. No. 15/981,516, dated Jul. 17, 2019, 5 pages.

(56) References Cited

OTHER PUBLICATIONS

Non-Final Office Action for U.S. Appl. No. 16/005,794, dated Oct. 7, 2019, 11 pages.
Notice of Allowance for U.S. Appl. No. 16/042,351, dated Nov. 18, 2019, 7 pages.
Non-Final Office Action for U.S. Appl. No. 15/008,586, dated Oct. 24, 2019, 10 pages.
Notice of Allowance for U.S. Appl. No. 16/005,794, dated Jan. 9, 2020, 7 pages.
Non-Final Office Action for U.S. Appl. No. 15/032,252, dated Dec. 27, 2019, 5 pages.
Non-Final Office Action for U.S. Appl. No. 15/191,541, dated Dec. 9, 2019, 7 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Non-Final Office Action for U.S. Appl. No. 15/039,435, dated Jan. 7, 2020, 5 pages.
Notice of Allowance for U.S. Appl. No. 15/981,516, dated Jan. 15, 2020, 7 pages.

\* cited by examiner

SPATIAL COMBINING DEVICES FOR HIGH-FREQUENCY OPERATION

RELATED APPLICATION

This application claims the benefit of provisional patent application Ser. Nos. 62/548,460, 62/548,447, 62/548,457, 62/548,464, and 62/548,472, all filed Aug. 22, 2017, the disclosures of which are incorporated herein by reference in their entireties.

FIELD OF THE DISCLOSURE

The disclosure relates generally to an amplifier assembly and, more particularly, to an amplifier assembly for a power-combining device.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna. When the amplifier assemblies are combined to form the coaxial waveguide, the input antennas may form an input antipodal antenna array, and the output antennas may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and output coaxial waveguide section combine the amplified split signals to form an amplified electromagnetic signal that is passed to an output port of the spatial power-combining device.

The performance of spatial power-combining devices depends on a number of parameters, including the size and spacing of amplifier assemblies relative to each other. In particular, the size and spacing of amplifier assemblies in a coaxial arrangement about a center axis is relatively important for a given operating frequency range and bandwidth of the spatial power-combining device. If the spacing between amplifier assemblies it too great, the device does not function; and if the spacing between amplifier assemblies is too close, there may be interference.

SUMMARY

The present disclosure relates to spatial power-combining devices and in particular to spatial power-combining devices with higher frequency operation and increased bandwidth.

In some embodiments, a spatial power-combining device comprises a center waveguide section comprising a plurality of amplifier assemblies. The plurality of amplifier assemblies form an input end and an output end. An input inner conductor is mechanically attached to the input end, and an output inner conductor is mechanically attached to the output end.

In some embodiments, a method is provided wherein a plurality of amplifier assemblies are joined together to provide a center waveguide section comprising an input end and an output end. The input end comprises an input connector receptacle, and the output end comprises an output connector receptacle. The method further comprises mechanically attaching an input inner conductor to the input connector receptacle and mechanically attaching an output inner conductor to the output connector receptacle.

In some embodiments, a spatial power-combining device comprises a plurality of amplifier assemblies. Each amplifier assembly comprises a body comprising a first face and a second face, wherein the second face forms a recess, an amplifier coupled to the first face, and an amplifier cover that covers the amplifier and extends beyond the first face. Each recess of the plurality of amplifier assemblies is configured to receive a portion of the amplifier cover from an adjacent amplifier assembly.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure relates to spatial power-combining devices and in particular to spatial power-combining devices with higher frequency operation and increased bandwidth.

The embodiments are particularly adapted to spatial power-combining devices that operate at microwave frequencies, such as, by way of non-limiting example, energy between about 300 MHz (100 cm wavelength) and 300 GHz (0.1 cm wavelength). Additionally, embodiments may comprise operating frequency ranges that extend above microwave frequencies. In some embodiments, by way of non-limiting examples, the operating frequency range includes an operating bandwidth spread of 4 GHz to 41 GHz.

A spatial power-combining device generally includes a plurality of amplifier assemblies, and each amplifier assembly is an individual signal path and includes an amplifier connected to an input antenna structure and an output antenna structure. An input coaxial waveguide is configured to provide a signal concurrently to each input antenna structure, and an output coaxial waveguide is configured to concurrently combine the amplified signals from each output antenna structure. The plurality of amplifier assemblies are arranged coaxially about a center axis. Accordingly, the spatial power-combining device is configured to split, amplify, and combine an electromagnetic signal.

Figure 1:
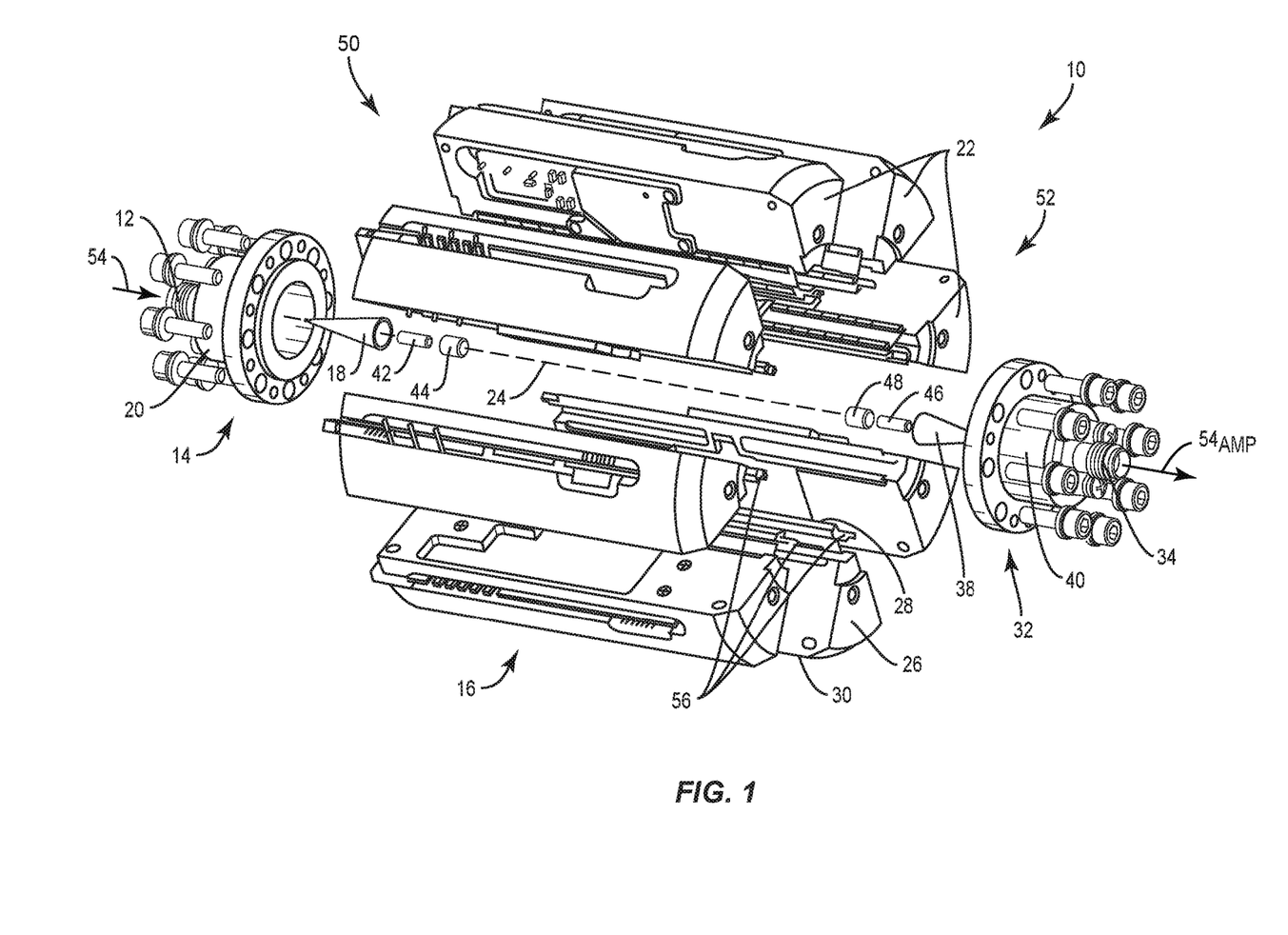
FIG. 1 is a perspective view of a spatial power-combining device according to some embodiments.

FIG. 1 is a perspective exploded view of a representative spatial power-combining device 10 according to some embodiments. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 comprises an input inner conductor 18 and an input outer conductor 20. Outer surfaces of the input inner conductor 18 and inner surfaces of the input outer conductor 20 have gradually changed profiles configured to minimize the impedance mismatch from the input port 12 to the center waveguide section 16.

The center waveguide section 16 comprises a plurality of amplifier assemblies 22 arranged radially around a center axis 24 of the spatial power-combining device 10. Each amplifier assembly 22 comprises a body 26 having a predetermined wedge-shaped cross-section, an inner surface 28, and an arcuate outer surface 30. When the amplifier assemblies 22 are collectively assembled, they may form a cylinder with a cylindrical central cavity, defined by the inner surfaces 28.

The spatial power-combining device 10 also comprises an output coaxial waveguide section 32 and an output port 34. The input port 12 and the output port 34 may be field-replaceable Subminiature A (SMA) connectors. In other embodiments, the input port 12 and the output port 34 may be super SMA connectors, type N connectors, K connectors, or any other suitable connectors. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 comprises an output inner conductor 38 and an output outer conductor 40. Outer surfaces of the output inner conductor 38 and inner surfaces of the output outer conductor 40 have gradually changed profiles configured to minimize the impedance mismatch from the output port 34 to the center waveguide section 16. In some embodiments, impedance matching is configured for 50 Ohms, although other designs such as 30 Ohms are possible. A first screw 42 and a first nut 44 are provided for mechanically attaching the input inner conductor 18 to the plurality of amplifier assemblies 22. In a similar manner, a second screw 46 and a second nut 48 are provided for mechanically attaching the output inner conductor 38 to the plurality of amplifier assemblies 22. The plurality of amplifier assemblies 22 comprise an input end 50 and an output end 52. The input inner conductor 18 is mechanically attached to the input end 50, and the output inner conductor 38 is mechanically attached to the output end 52. Accordingly, a spatial power-combining device 10 is provided that comprises a center waveguide section 16 comprising a plurality of amplifier assemblies 22, wherein the plurality of amplifier assemblies 22 forms an input end 50 and an output end 52, an input inner conductor 18 mechanically attached to the input end 50, and an output inner conductor 38 mechanically attached to the output end 52. In some embodiments, the input inner conductor 18 may be directly attached to the input end 50 and the output inner conductor 38 may be directly attached to the output end 52.

In conventional spatial power-combining devices, inner conductors may be mechanically attached to a separate support element, such as a center post or rod. Amplifier assemblies may be stacked circumferentially around the center post and may have inner surfaces that conform to the outer shape of the center post. Accordingly, the conventional center post is provided for mechanical support and assembly of the spatial power-combining device. As previously described, mechanical support in the spatial power-combining device 10 of FIG. 1 comprises mechanically attaching the input inner conductor 18 to the input end 50 of the plurality of amplifier assemblies 22 and mechanically attaching the output inner conductor 38 to the output end 52 of the plurality of amplifier assemblies 22. A separate support element, such as a center post or rod, is therefore not required for assembly. Removing the center post may have particular benefit for applications that include higher frequency operation with shorter wavelengths of electromagnetic radiation and increased bandwidth. For these applications, it may be preferable for the spatial power-combining device 10 to have smaller dimensions. Accordingly, the spacing of amplifier assemblies relative to each may be reduced around the center axis 24 without a center post. In some applications, the operating frequency range includes an operating bandwidth spread of 4 GHz to 41 GHz.

In operation, the input port 12 receives a signal 54 and the input coaxial waveguide section 14 is configured to provide the signal 54 concurrently to each of the amplifier assemblies 22 where the signal is concurrently amplified by the respective amplifier assemblies 22. The output coaxial waveguide section 32 is configured to concurrently combine the amplified signals to form an amplified output signal $54_{AMP}$, which is propagated through the output coaxial waveguide section 32 to the output port 34 for transmitting the amplified output signal $54_{AMP}$.

Figure 2:
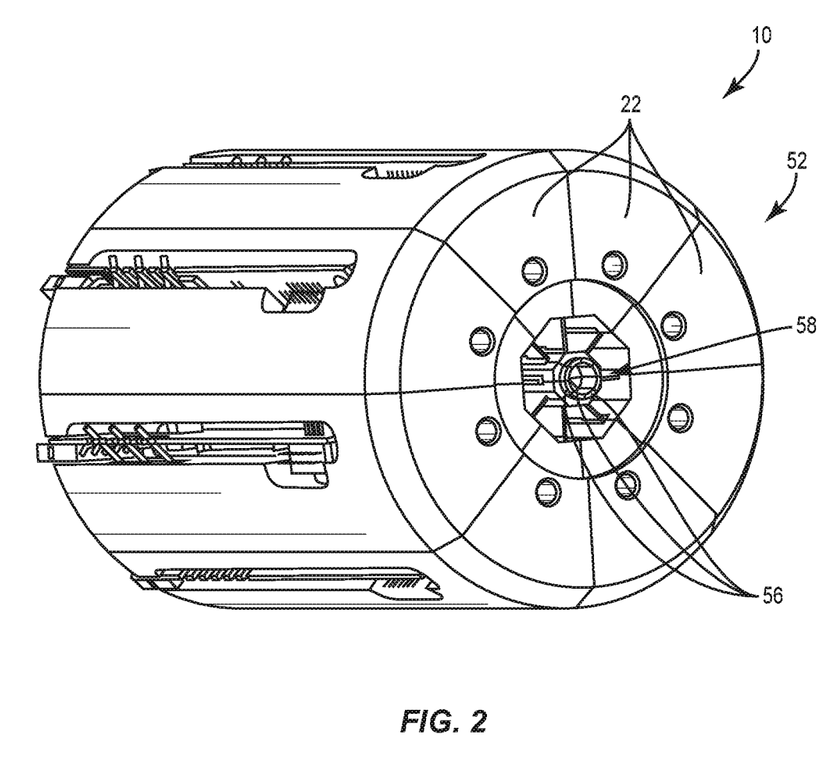
FIG. 2 is a perspective view of a spatial power-combining device according to some embodiments.

According to some embodiments, the amplifier assemblies 22 each comprise an output connector portion 56 configured to mechanically attach to the output inner conductor 38. FIG. 2 is an assembled perspective view of the spatial power-combining device 10 of FIG. 1 where the output coaxial waveguide section 32 and output port 34 have been removed to expose the output end 52 of the plurality of amplifier assemblies 22. The output connector portions 56 of the plurality of amplifier assemblies 22 collectively forms an output connector receptacle 58. In FIG. 2, each output connector portion 56 is curved to form an output connector receptacle 58 that is cylindrical, although other shapes are possible, such as polygonal. A output connector receptacle 58 that is polygonal may be formed when each output connector portion 56 is straight and accordingly the number of sides may be a function of the number of amplifier assemblies 22. For example, the output connector receptacle 58 may be square-shaped with four amplifier assemblies, hexagonal-shaped with six amplifier assemblies, octagonal-shaped with eight amplifier assemblies, and so on. In a similar manner with respect to the output connector portion 56 and the output connector receptacle 58, the plurality of amplifier assemblies 22 each further comprise an input connector portion that collectively forms an input connector receptacle, not visible in FIGS. 1 and 2. Accordingly, it is understood the amplifier assemblies 22 each comprise an input connector portion configured to mechanically attach to the input inner conductor 18.

Figure 3:
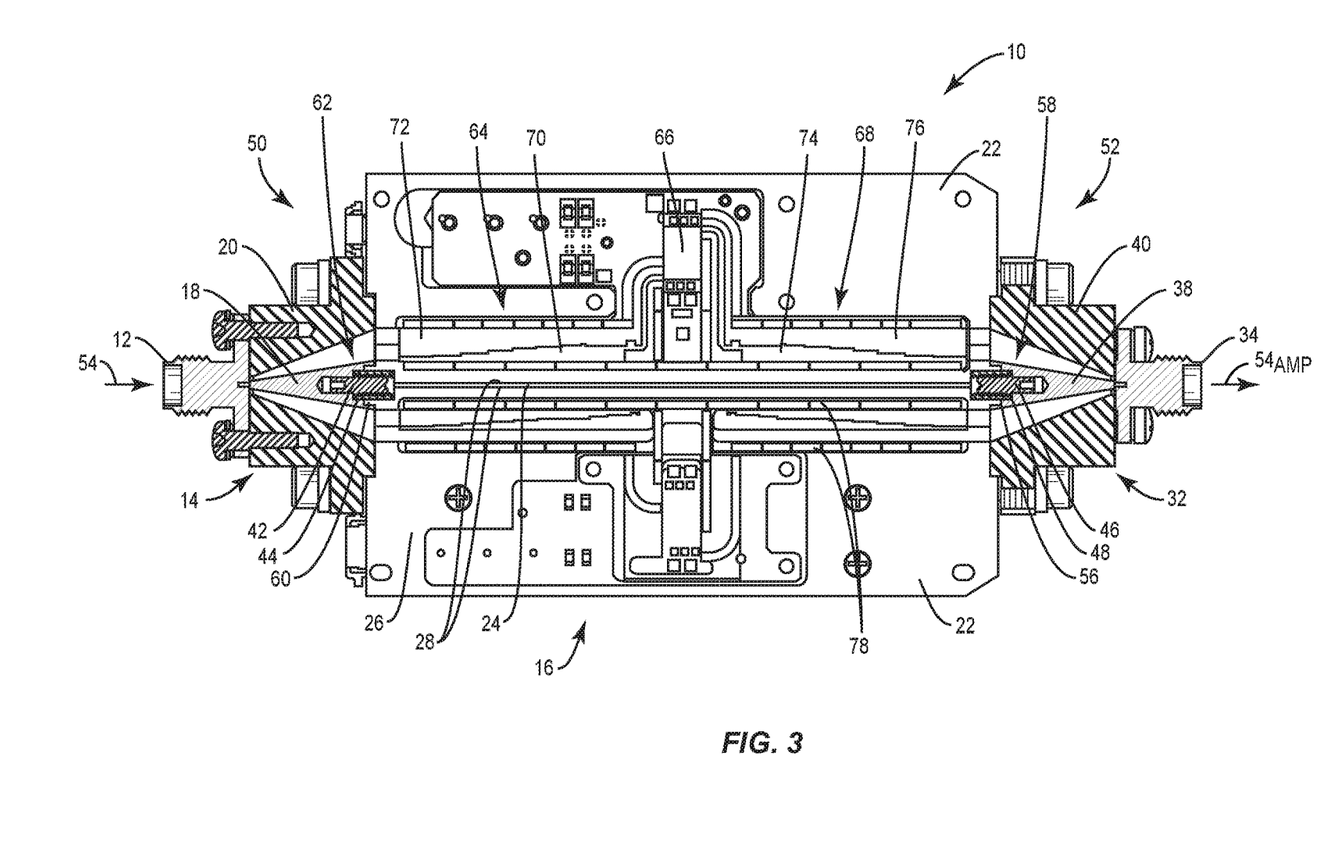
FIG. 3 is a partial cross-sectional view of a spatial power-combining device according to some embodiments.

FIG. 3 is a partial and unexploded cross-sectional view of the spatial power-combining device 10 of FIG. 1. Several amplifier assemblies 22 are omitted to illustrate the following details. Both the input end 50 and the output end 52 of the plurality of amplifier assemblies 22 are visible within the center waveguide section 16. The input port 12 and input coaxial waveguide section 14 are located adjacent the input end 50, and the output port 34 and output coaxial waveguide section 32 are located adjacent the output end 52. The input coaxial waveguide section 14 comprises the input inner conductor 18 and the input outer conductor 20, and the output coaxial waveguide section 32 comprises the output inner conductor 38 and the output outer conductor 40. The output connector portions 56 of the plurality of amplifier assemblies 22 collectively form an output connector receptacle 58, and the input connector portions 60 of the plurality of amplifier assemblies 22 collectively form an input connector receptacle 62. As shown, the input inner conductor 18 is configured to mechanically attach to the input end 50 at the input connector receptacle 62 by the first screw 42, and the output inner conductor 38 is configured to mechanically attach to the output end 52 at the output connector receptacle 58 by a second screw 46. The first nut 44 is inside the input connector receptacle 62 and is configured to receive the first screw 42, and the second nut 48 is inside the output connector receptacle 58 and is configured to receive the second screw 46. The mechanical attachment of the input inner conductor 18 and the output inner conductor 38 to the input end 50 and output end 52, respectively, allows the center axis 24 to be hollow, and thus the inner surface 28 of the body 26 of each amplifier assembly 22 is separated from the center axis 24 by empty space. For example, inner surface 28 of each amplifier assembly 22 is separated from the center axis 24 completely by empty space, with no support structure in between. In some embodiments, the inner surface 28 of each amplifier assembly 22 is spaced from the center axis 24 by a distance of no more than 50 mil, and in further embodiments the spacing may be lower. For example, the inner surface 28 of each amplifier assembly 22 may be spaced from the center axis 24 by a distance of about 10 mil. Amplifier assemblies in conventional spatial power-combining devices are not spaced from a center axis by a distance of 50 mil or less due to the presence of the center rod. For example, conventional spatial power-combining devices with center rods typically have amplifier assemblies spaced from the center axis by at least 80 mil.

Accordingly, the spacing of the amplifier assemblies can be reduced to achieve higher frequency operation and increased bandwidth. In some applications, the operating frequency range includes an operating bandwidth spread of 4 GHz to 41 GHz. For such applications, the reduced spacing may only allow for a reduced number of amplifier assemblies. In some embodiments, the plurality of amplifier assemblies comprise fewer than ten amplifier assemblies. For an operating bandwidth spread of 4 GHz to 41 GHz, some embodiments may comprise eight amplifier assemblies and may therefore be referred to as an eight-way spatial power-combining device, as represented in FIG. 1. In other embodiments with a lower operating bandwidth spread, such as 2 GHz to 20 GHz, the spacing may be greater than these ranges and more amplifier assemblies may be included.

As shown in FIG. 3, each amplifier assembly 22 comprises an input antenna structure 64, an amplifier 66, and an output antenna structure 68. In some embodiments, the amplifier 66 comprises a monolithic microwave integrated circuit (MMIC) amplifier. The MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss. The input antenna structure 64 comprises an input antenna pattern 70 supported on a first board 72, and the output antenna structure 68 comprises an output antenna pattern 74 supported on a second board 76. The first board 72 and second board 76 may be printed circuit boards that provide the desired form factor and mechanical support for the input antenna pattern 70 and output antenna pattern 74, respectively. It is understood that both input antenna pattern 70 and output antenna pattern 74 may include signal and ground portions on opposing sides of the first board 72 and second board 76, respectively. Additionally, one or more electromagnetic interference filters 78 are supported on both the first board 72 and the second board 76. The electromagnetic interference filters 78 are located around the input antenna pattern 70 and output antenna pattern 74 to help suppress modes and reduce leakage between amplifier assemblies 22. In other embodiments, the input antenna pattern 70 and output antenna pattern 74 may comprise metal that is thick enough to be incorporated into each amplifier assembly 22 without requiring a first board 72 or second board 76 for support.

In operation, the signal 54 enters through input port 12 and propagates through input coaxial waveguide 14 to the input antenna structure 64 of each amplifier assembly 22. Each input antenna structure 64 couples the signal 54 to each amplifier 66, and each output antenna structure 68 couples the amplified signal $54_{AMP}$ to the output coaxial waveguide section 32 to be propagated to the output port 34.

Figure 4:
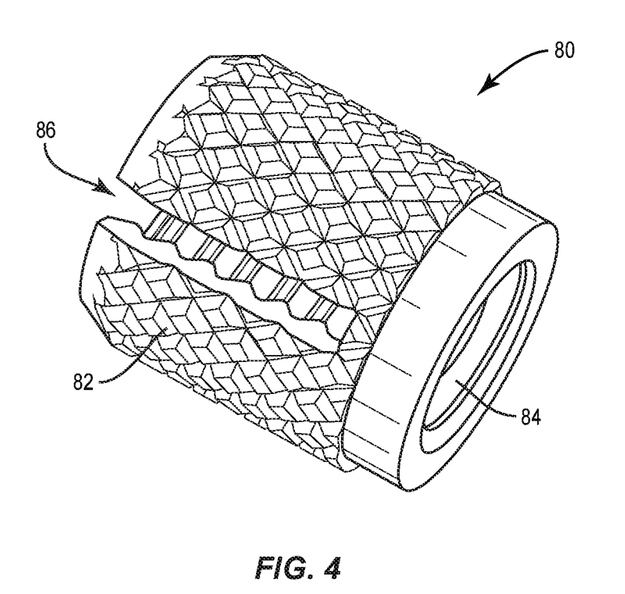
FIG. 4 is a perspective view of a representative element of a spatial power-combining device according to some embodiments.

FIG. 4 is a perspective view of a representative nut 80 that may be either the first nut 44 or second nut 48 as previously described. The representative nut 80 comprises an outer surface 82 and a threaded inner surface 84. The outer surface 82 may be knurled, textured, or patterned. The representative nut 80 may also be expandable by way of a split 86.

Figure 5:
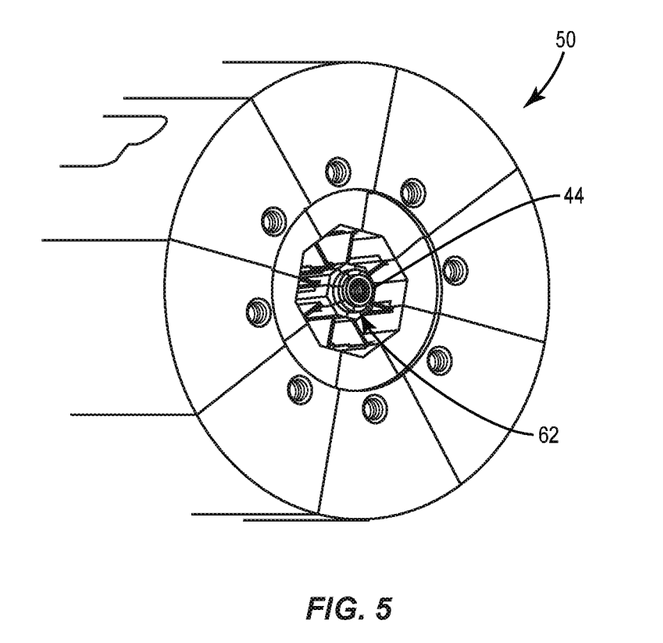
FIG. 5 is a perspective view of a portion of a spatial power-combining device according to some embodiments.
Figure 6:
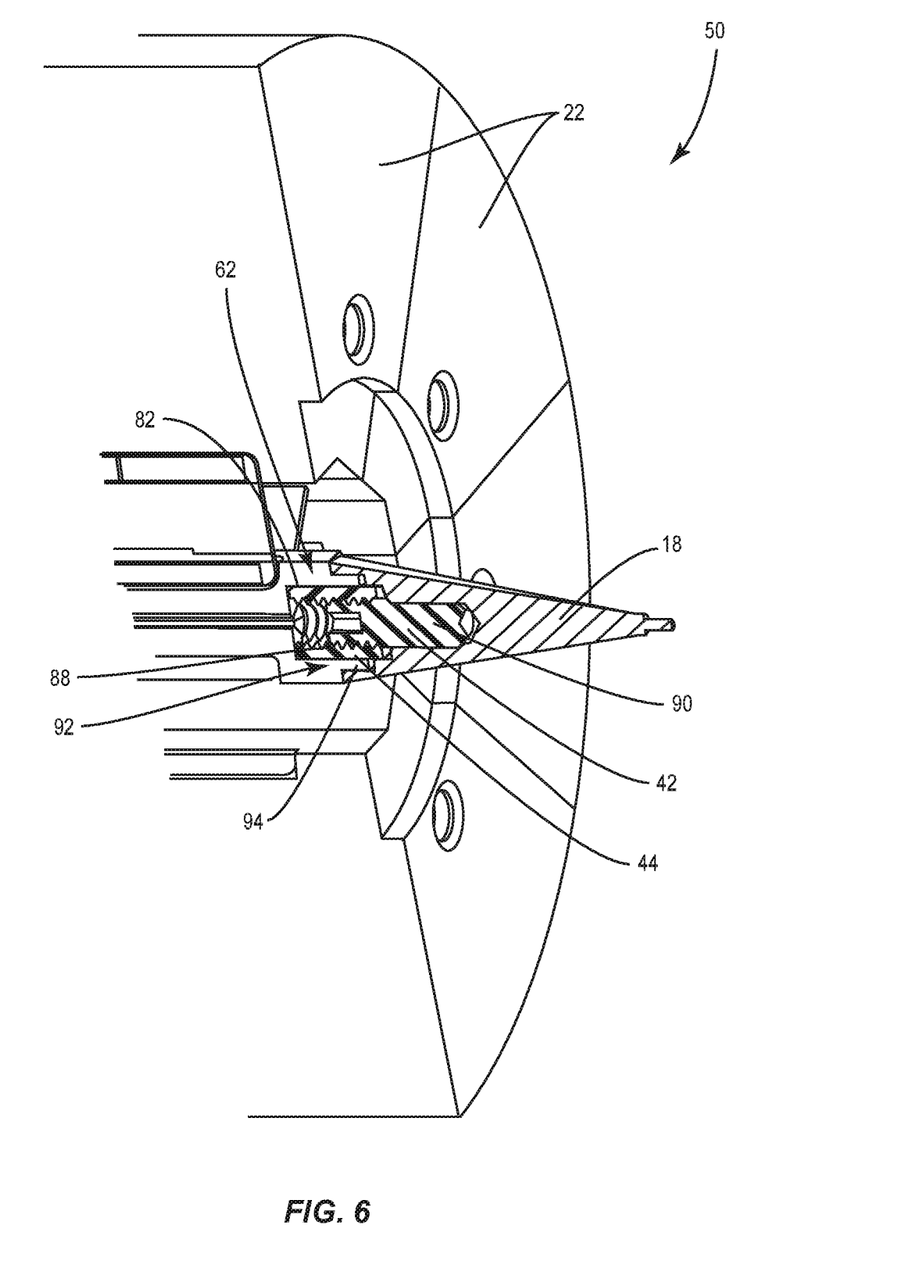
FIG. 6 is a perspective view of a portion of a spatial power-combining device according to some embodiments.

FIGS. 5 and 6 are perspective views that may be either the input end 50 or output end 52 as previously described. The following example is described for the example in which FIGS. 5 and 6 are views of the input end 50. The first nut 44 is pressed into input connector receptacle 62. The outer surface 82 of the first nut 44 is knurled (shown in FIG. 4) to grip the input connector receptacle 62. In FIG. 6, the first screw 42 mechanically attaches the input inner conductor 18 to the input end 50 of the plurality of amplifier assemblies 22. The first screw 42 comprises a first threaded portion 88 that is engaged with the threaded inner surface 84 (shown in FIG. 4) of the first nut 44 and a second portion 90 that is coupled to the input inner conductor 18. For further mechanical support and coupling, the input inner conductor 18 forms a receiving cavity 92, and the input connector receptacle 62 comprises a first protrusion 94 that extends into the receiving cavity 92. During assembly, the first nut 44 is pressed into the input connector receptacle 62 and held in place by the knurled outer surface 82. As the first screw 42 is threaded into the first nut 44, the first nut 44 expands inside the input connector receptacle 62 by way of the split 86 (shown in FIG. 4) to fix the first nut 44 in place relative to the input connector receptacle 62 and the receiving cavity 92. It is understood that the description of FIGS. 5 and 6 would be the same for the output end 52 of the plurality of amplifier assemblies 22.

Figure 7:
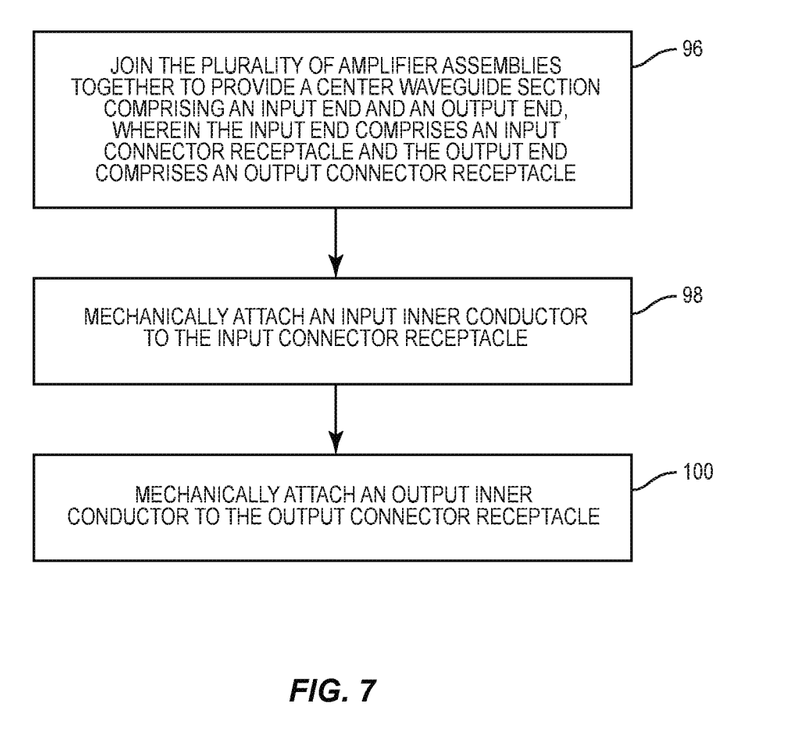
FIG. 7 is a flowchart of a method according to some embodiments.

FIG. 7 is a flowchart of a method according to some embodiments. The method includes joining the plurality of amplifier assemblies 22 together to provide a center waveguide section 16 comprising an input end 50 and an output end 52, wherein the input end 50 comprises an input connector receptacle 62 and the output end 52 comprises an output connector receptacle 58 (block 96), mechanically attaching an input inner conductor 18 to the input connector receptacle 62 (block 98), and mechanically attaching an output inner conductor 38 to the output connector receptacle 58 (block 100). Mechanically attaching the input inner conductor 18 to the input connector receptacle 62 may include providing a first nut 44 within the input connector receptacle 62 and subsequently attaching a first screw 42 between the input inner conductor 18 and the first nut 44. The first nut 44 may expand within the input connector receptacle 62 during attachment of the first screw 42. In a similar manner, mechanically attaching the output inner conductor 38 to the output connector receptacle 58 may include providing a second nut 48 within the output connector receptacle 58 and subsequently attaching a second screw 46 between the output inner conductor 38 and the second nut 48.

Figure 8:
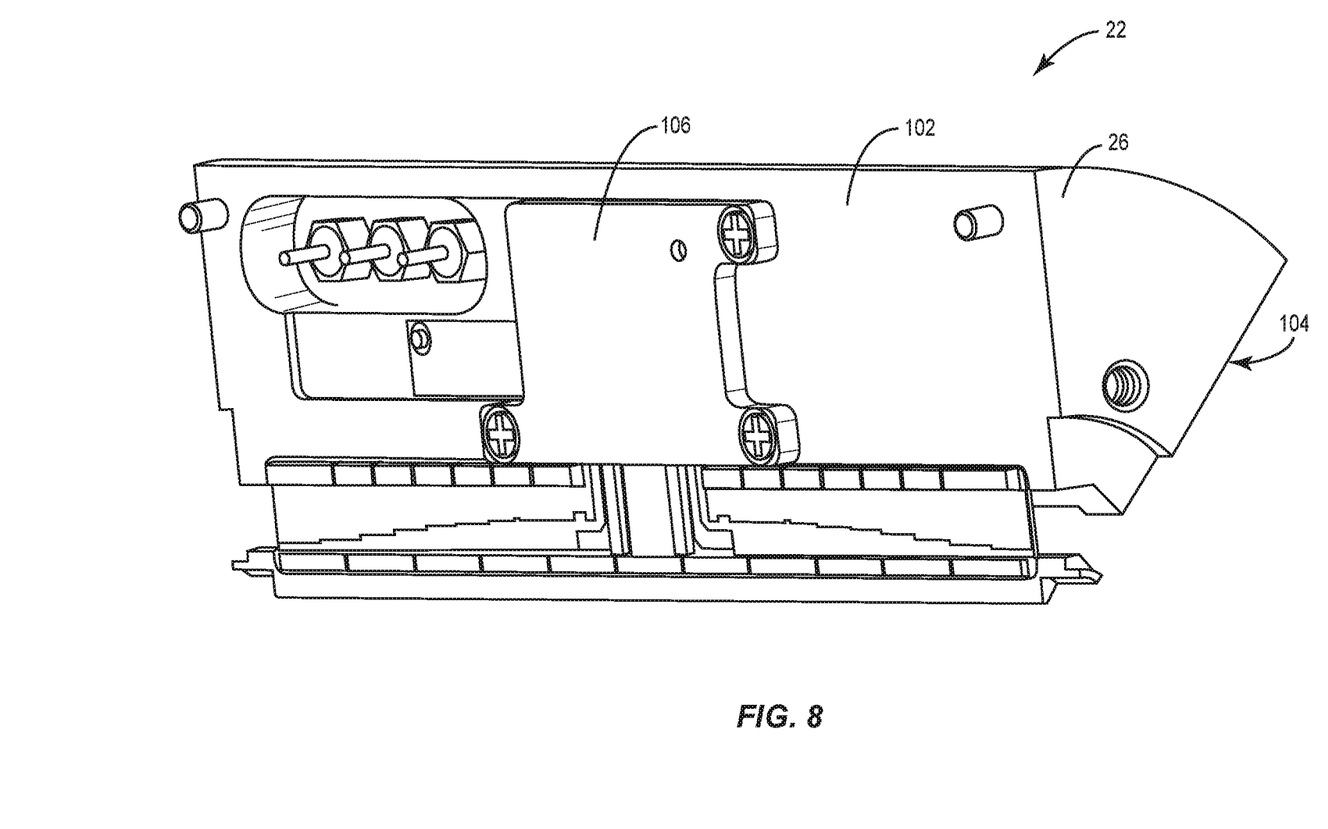
FIG. 8 is a perspective view of an amplifier assembly according to some embodiments.

FIG. 8 is a perspective view of the amplifier assembly 22 according to some embodiments. As shown in FIG. 8, the amplifier assembly 22 includes a body 26 with a first face 102 and a second face 104. An amplifier cover 106 is coupled to the first face 102 and covers the amplifier 66 (shown in FIG. 2). As previously described, the amplifier 66 may be a solid-state gallium nitride (GaN)-based MMIC. The amplifier cover 106 provides a specific form factor to provide bandwidth stability between amplifier assemblies 22 when spatially arranged. Additionally, the use of an amplifier cover 106 provides the ability to tune characteristics of the MMIC within the amplifier assembly 22 simply by selecting an amplifier cover 106 with a different form factor.

Figure 9:
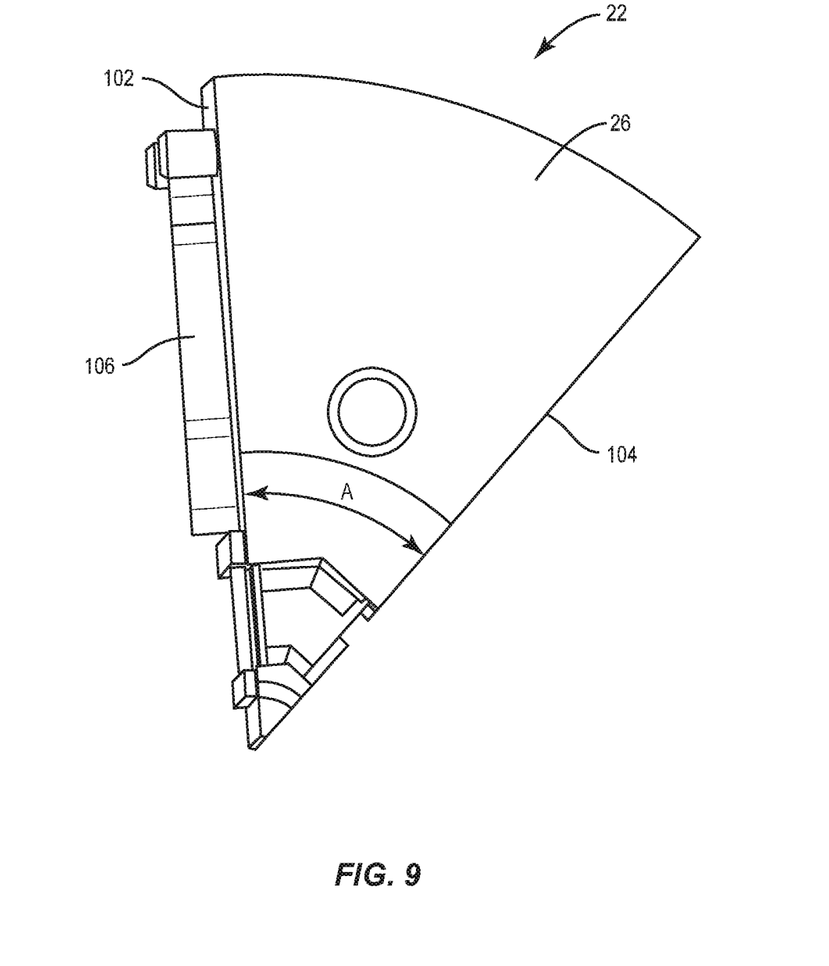
FIG. 9 is a perspective view of an amplifier assembly according to some embodiments.

As shown in FIG. 9, the body 26 is wedge-shaped for applications where a plurality of amplifier assemblies 22 are arranged radially with respect to each other. The angle A of the body may be determined by the number of amplifier assemblies 22 to be radially arranged. For example, eight amplifier assemblies 22 would have an angle A of 45°, whereas 16 amplifier assemblies 22 would have an angle A of 22.5°. As further shown in FIG. 9, the amplifier cover 106 extends beyond or protrudes from the first face 102.

Figure 10:
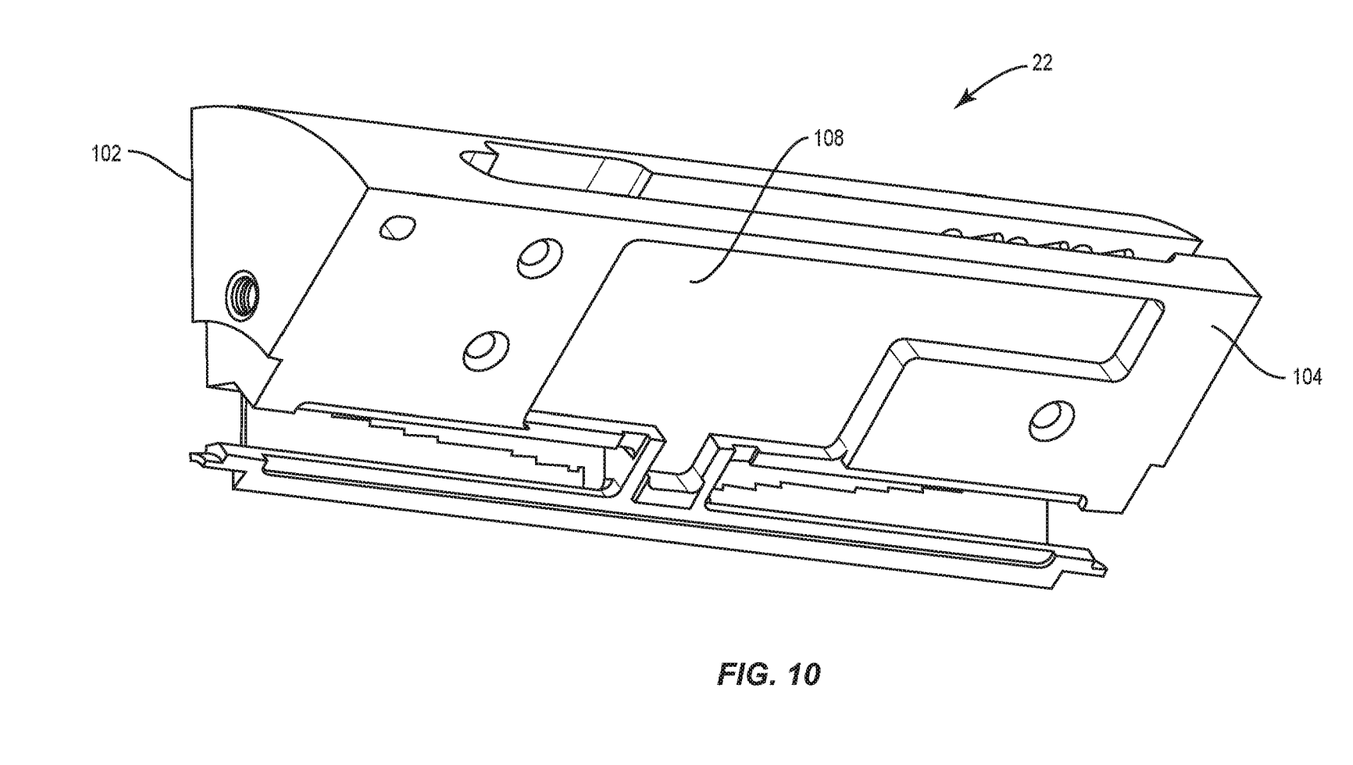
FIG. 10 is a perspective view of an amplifier assembly according to some embodiments.

In FIG. 10, the second face 104 forms a recess 108 that is configured to receive at least a portion of the amplifier cover 106 from an adjacent amplifier assembly 22. The recess 108 provides the ability to space adjacent amplifiers closer together for higher frequency and increased bandwidth applications. Referring back to FIG. 1, the amplifier assemblies 22 are arranged radially around a center axis 24 and receive a signal 54 from the input port 12 and input coaxial waveguide section 14 and transmit the amplified signal $54_{AMP}$ to the output coaxial waveguide section 32 and output port 34.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising:
a center waveguide section comprising a plurality of amplifier assemblies, wherein the plurality of amplifier assemblies form an input end and an output end, and wherein each amplifier assembly of the plurality of amplifier assemblies comprises an input antenna structure, an amplifier, an output antenna structure, and input connector portion, and an output connector portion;
an input inner conductor mechanically attached to the input connector portion at the input end; and
an output inner conductor mechanically attached to the output connector portion at the output end.

2. The spatial power-combining device of claim 1 further comprising:
an input coaxial waveguide section comprising the input inner conductor and an input outer conductor; and
an output coaxial waveguide section comprising the output inner conductor and an output outer conductor.

3. The spatial power-combining device of claim 2 further comprising an input port for receiving a signal and an output port for transmitting an amplified signal.

4. The spatial power-combining device of claim 1 wherein the input connector portions of the plurality of amplifier assemblies collectively form an input connector receptacle.

5. The spatial power-combining device of claim 4 wherein the output connector portions of the plurality of amplifier assemblies collectively form an output connector receptacle.

6. The spatial power-combining device of claim 5 wherein the input inner conductor is mechanically attached to the input connector receptacle by a first screw and the output inner conductor is mechanically attached to the output connector receptacle by a second screw.

7. The spatial power-combining device of claim 6 further comprising:
a first nut inside the input connector receptacle configured to receive the first screw; and
a second nut inside the output connector receptacle configured to receive the second screw.

8. The spatial power-combining device of claim 7 wherein the first nut comprises a knurled outer surface and a threaded inner surface.

9. The spatial power-combining device of claim 8 wherein the first screw comprises a first threaded portion that is engaged with the threaded inner surface of the first nut and a second portion that is coupled to the input inner conductor.

10. The spatial power-combining device of claim 4 wherein the input inner conductor forms a receiving cavity and the input connector receptacle comprises a first protrusion that extends into the receiving cavity.

11. The spatial power-combining device of claim 1 wherein the plurality of amplifier assemblies is arranged radially around a center axis of the spatial power-combining device.

12. The spatial power-combining device of claim 11 wherein each amplifier assembly of the plurality of amplifier assemblies comprises:
a body comprising an inner surface;
wherein the inner surface of each amplifier assembly is separated from the center axis by empty space.

13. The spatial power-combining device of claim 11 wherein each amplifier assembly of the plurality of amplifier assemblies comprises;
a body comprising an inner surface;
wherein the inner surface of each amplifier assembly is separated from the center axis by a distance of no more than 50 mil.

14. The spatial power-combining device of claim 1 comprising an operating bandwidth spread of 4 GHz to 41 GHz.

15. The spatial power-combining device of claim 1 wherein the plurality of amplifier assemblies comprises fewer than 10 amplifier assemblies.

16. The spatial power-combining device of claim 1 wherein the input antenna structure comprises:
a first board;
an input antenna pattern supported on the first board; and
one or more electromagnetic interference filters supported on the first board.

17. A method comprising:
joining a plurality of amplifier assemblies together to provide a center waveguide section comprising an input end and an output end, wherein each amplifier assembly of the plurality of amplifier assemblies comprises an input antenna structure, an amplifier, and an output antenna structure, an input connector portion, and an output connector portion, and wherein the input connector portion of each amplifier assembly forms part of an input connector receptacle at the input end and the output connector portion of each amplifier assembly forms part of an output connector receptacle at the output end;
mechanically attaching an input inner conductor to the input connector receptacle; and mechanically attaching an output inner conductor to the output connector receptacle.

18. The method of claim 17, further comprising:
providing a first nut within the input connector receptacle; and
providing a second nut within the output connector receptacle.

19. The method of claim 18, further comprising mechanically attaching a first screw between the input inner conductor and the first nut and mechanically attaching a second screw between the output inner conductor and the second nut.

20. The method of claim 19 wherein mechanically attaching the first screw expands the first nut within the input connector receptacle and mechanically attaching the second screw expands the second nut within the output connector receptacle.

21. A spatial power-combining device comprising:
a plurality of amplifier assemblies, wherein each amplifier assembly comprises:
a body comprising a first face and a second face, wherein the second face forms a recess;
an amplifier coupled to the first face; and
an amplifier cover that covers the amplifier and extends beyond the first face;
wherein each recess of each amplifier assembly of the plurality of amplifier assemblies is configured to receive a portion of the amplifier cover from an adjacent amplifier assembly.

22. The spatial power-combining device of claim 21 wherein the plurality of amplifier assemblies is arranged radially around a center axis of the device.

23. The spatial power-combining device of claim 21 further comprising an input port for receiving a signal and an output port for transmitting an amplified signal.

24. The spatial power-combining device of claim 21 further comprising an input coaxial waveguide section and an output coaxial waveguide section.

\* \* \* \* \*

UNITED STATES PATENT AND TRADEMARK OFFICE
CERTIFICATE OF CORRECTION

PATENT NO. : 10,587,027 B2
APPLICATION NO. : 15/846840
DATED : March 10, 2020
INVENTOR(S) : Ankush Mohan et al.

It is certified that error appears in the above-identified patent and that said Letters Patent is hereby corrected as shown below:

In the Specification

In Column 1, Lines 6-8, replace "This application claims the benefit of provisional patent application Ser. Nos. 62/548,460, 62/548,447, 62/548,457, 62/548,464, and 62/548,472" with --This application claims the benefit of provisional patent application Ser. Nos. 62/548,460, 62/548,447, 62/548,448, 62/548,457, 62/548,464, and 62/548,472--.

Signed and Sealed this
Twelfth Day of May, 2020

Andrei Iancu
*Director of the United States Patent and Trademark Office*